DELTA MODULATOR USING OPERATIONAL INTEGRATION

Filed July 5, 1966

Inventor
BARNEY M. KROLL

BY

Mueller, Aichele & Rauner ATTYS.

United States Patent Office 3,461,406

Patented Aug. 12, 1969

3,461,406

DELTA MODULATOR USING OPERATIONAL INTEGRATION

Barney M. Kroll, Morton Grove, Ill., assignor to Motorola, Inc., Franklin Park, Ill., a corporation of Illinois Filed July 5, 1966, Ser. No. 562,872
Int. Cl. H03k *7/02;* H03o *3/08*
U.S. Cl. 332—11 6 Claims

ABSTRACT OF THE DISCLOSURE

A delta modulator is provided including an amplifier with degenerative feedback the output of which drives a multivibrator. The output of the multivibrator is also degeneratively coupled back to the input of the amplifier. The circuit provides a high degree of isolation between the modulation signal and the digital signals using passive components.

In the usual delta modulator the modulation input signal is compared with the digitally reproduced modulation signal which is available from the integrator. Both signals are coupled to a comparator in parallel or in series and the difference between the two signals is sampled at regular intervals by clock pulses. A multivibrator circuit is triggered either on or off depending on the polarity of the difference signal to provide a digital output signal from the delta modulator. This digital signal is also fed back to the integrator.

One problem in the usual delta modulator is that in order to achieve isolation between the sources of the modulation signal and the integrated digital signal, the two signals must be coupled to a common summing point through isolation networks such as would be provided by a comparator. Each of the isolation networks must take the full voltage excursion of the signal applied to it. In prior art circuits, particularly those using semiconductor devices, it has been necessary to use active devices and relatively complex circuitry to achieve isolation. In any practical comparator circuit, the input signal excursion is also limited by the common mode rejection characteristics of the device, further reducing the dynamic range which can be accepted by the delta modulator without distortion.

It is, therefore, an object of this invention to provide an improved form of a delta modulator in which the input signals can be coupled to a common summing point through simple circuitry including only inactive circuit elements.

Another object of this invention is to provide a delta modulator circuit which achieves a high degree of isolation between the input modulation signal and the integrated digital signals coupled to a common summing point.

Another object of this invention is to provide a delta modulator circuit having input circuits capable of accepting signals having a large dynamic range.

A feature of this invention is the provision of a delta modulator circuit in which the common summing point of the delta modulator is coupled to an amplifier and which includes capacitance means coupled to the common summing point.

Another feature of this invention is the provision of a delta modulator circuit wherein the capacitor means includes a degenerative feedback path coupling the output of the amplifier to the common summing point, and a resistive feedback path coupling the digital signal to the common summing point with the resistive feedback path and the capacitive means forming an integration network.

Another feature of this invention is the provision of a delta modulator circuit wherein the capacitor means includes a capacitor coupling the common summing point to a reference potential with the resistive feedback path and the capacitor forming an integration network.

The invention is illustrated in the drawings in which.

Figures 1, 2, 3:
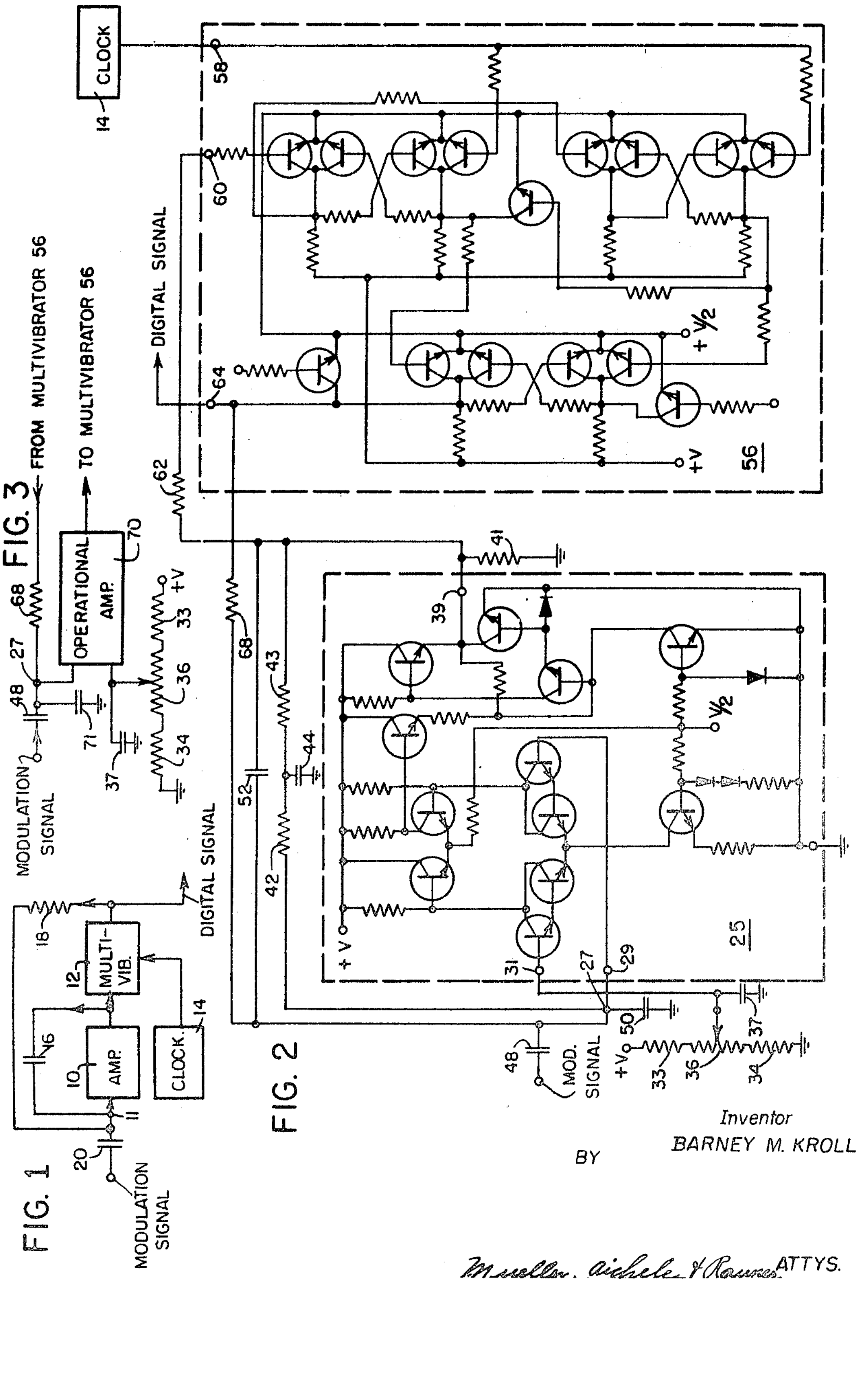
FIG. 1 is a simplified block diagram and schematic illustrating the invention.
FIG. 2 is a partial block diagram and partial schematic showing a particular embodiment of the invention.
FIG. 3 is a partial block diagram and partial schematic showing another embodiment of the invention.

In practicing this invention a delta modulator is provided having an amplifier with an input circuit including a summing point and an output circuit. A capacitive degenerative feedback path couples the output circuit of the amplifier to the input circuit. The output circuit of the amplifier is further coupled to a multivibrator. A clock is also coupled to the multivibrator to provide a signal which periodically enables the multivibrator. During the enabling period the multivibrator is established in one of two possible states depending upon the amplitude of the signal from the amplifier. The output of the multivibrator is in the form of a digital signal which is coupled to other circuitry for use thereby. A resistive feedback circuit couples the digital signal from the multivibrator to the summing point. The resistive feedback circuit together with the capacitance of the degenerative feedback circuit forms an integrating circuit so that the digital signal appearing at the summing point is integrated. A modulation signal is also applied to the summing point and a difference signal representing the sum of the modulation signal and the integrated digital signal is applied to the amplifier for amplification thereby.

The circuit so constructed is particularly adapted for implementation by use of commercially available integrated circuit modules. Since the effective capacitance of the degenerative feedback circuit is equal to $(A+1)C$, where A is the open loop gain of the amplifier and C is the capacitance of the degenerative feedback circuit, relatively long integration times are possible with small capacitors. In addition the circuit elements coupling the digital signal and the modulation signal to the summing point may be passive circuit elements since the summing point is a virtual ground and therefore the input signals to this point are isolated from each other.

In another embodiment of the circuit the capacitive of the degenerative feedback means coupling the output of the amplifier to its input is replaced by a separate capacitor. This separate capacitor is coupled between the summing point and a reference potential. The separate capacitor cooperates with the resistive feedback circuit to form an integration circuit.

Referring to FIG. 1 there is shown a partial block diagram and partial schematic of a circuit incorporating the features of this invention. Amplifier 10 may be implemented by an operational amplifier which is commercially available in integrated circuit form. The output of amplifier 10 is coupled to multivibrator circuit 12. Clock 14 is also coupled to multivibrator 12 for periodically enabling multivibrator 12. Multivibrator 12 is responsive to the output signal from amplifier 10 to assume one state if the output signal is below a threshold amplitude and to assume a second state if the output signal is above a threshold level. Multivibrator 12 acts to change states only during the period of time it is enabled by clock 14. Multivibrator 12 may be implemented by commercially available integrated circuit elements.

The output of amplifier 10 is also coupled to summing point 11 by capacitor 16. While only a single capacitor is shown coupling the output of amplifier 10 to summing point 11, it should be understood that the signal coupled to summing point 11 is out of phase with the signal applied to amplifier 10 so that a degenerative feedback circuit results. This phase relationship may be established in amplifier 10 or in the feedback circuit which includes capacitor 16.

The modulation signal is coupled to summing point 11 through capacitor 20. The digital output signal from multivibrator 12 is coupled to summing point 11 through resistor 18. Resistor 18 and capacitor 16 form an integrating network so that the digital signal appearing at summing point 11 is integrated. The effective capacitance of capacitor 16 at summing point 11 is equal to $(A+1)C$ where C is the capacitance of capacitor 16 and A is the open loop gain of amplifier 10. Thus a large integration time constant can be obtained with small values of capacitor 16. The phase relationship between the integrated digital signal and the modulation signal appearing at summing point 11, is such that the integrated digital signal acts as a degenerative feedback signal.

The degenerative feedback signals applied to summing point 11 through capacitor 16 and resistor 18 act to reduce the modulation signal appearing there to a very low value and summing point 11 may be considered a virtual ground with respect to the modulation signal. Thus a minimum of interaction between the modulation signal and the digital signal will occur when they are coupled together in this manner. An example of the amplitudes of the signals which may appear in this circuit are as follows: with the output of multivibrator 12 a digital signal of either zero or +8 volts and the modulation signal having a peak-to-peak amplitude of 4 volts, the amplitude of a typical signal appearing at summing point 11 is of the order of 10 millivolts. Since the applied signals are of the order of 1,000 times greater than the signal at summing point 11, the signal at this point will not affect the input signals appreciably and therefore there is a high degree of isolation between the digital signal input and modulation signal input. This isolation is achieved with only resistor 18 and capacitor 20 coupling the signals to the common summing point 11. Since the coupling elements are passive elements the input signals can have a large dynamic range without distortion.

Referring to FIG. 2 there is shown a partial schematic and a partial block diagram of a specific embodiment of the delta modulator of FIG. 1. In FIG. 2 the amplifier 10 of FIG. 1 is implemented by an operational amplifier 25 having a Darlington input. For example, operational amplifier 25 may be in the form of a commercially available integrated circuit unit such as the MC1531 manufactured by Motorola, Inc. The MC1531 has a typical open loop voltage gain of 3500. Amplifier 25 is not limited to this form of amplifier, however.

Summing point 27 is coupled to input 29 of operational amplifier 25. A bias stabilization network for operational amplifier 25 is coupled to the second input 31. The stabilization network consists of a voltage divider including fixed resistances 33 and 34 coupled in series with potentiometer 36. The movable arm of potentiometer 36 is coupled to input 31. A bypass capacitor 37 is coupled between the movable arm of potentiometer 36 and ground. The output terminal 39 of operational amplifier 25 is coupled to ground through a load resistor 41. A DC feedback stabilization network consisting of resistors 42 and 43 and bypass capacitor 44 is coupled between output terminal 39 and input terminal 29. The DC stabilization feedback network acts to stabilize the DC operating point of operational amplifier 25.

The modulation signal is coupled to summing point 27 through coupling capacitor 48. Bypass capacitor 50 acts to stabilize operational amplifier 25. A feedback capacitor 52 is coupled between output terminal 39 and input terminal 29 for providing degenerative AC feedback for the operational amplifier.

Multivibrator 12 of FIG. 1 is implemented by multivibrator 56 of FIG. 2. Multivibrator 56 may be in the form of a commercially available integrated circuit multivibrator produced by Motorola, Inc. under the designation MC913G. Multivibrator 56 is not limited to this form of multivibrator.

Clock 14 is coupled to terminal 58 of multivibrator 56. Output terminal 39 of operational amplifier 25 is coupled to the input terminal 60 of multivibrator 56 through current limiting resistor 62. Current limiting resistor 62 acts to limit the current drawn by multivibrator 56 thereby minimizing loading of operational amplifier 25 by multivibrator 56.

Multivibrator 56 is a storage element and acts to store the state of terminal 60 only during the negative transition of the clock signal. The multivibrator is not affected by voltage changes on input terminal 60 when the clock signal is in either its high or low state. If the voltage applied to input terminal 60 is below a predetermined threshold state, during the negative transition of the clock signal, multivibrator 56 assumes one state. If the voltage appearing on input terminal 60 is above the predetermined threshold level during the negative transition of the clock signal, multivibrator 56 assumes a second state. A digital signal is developed at output terminal 64 depending upon the state of the multivibrator 56.

The digital signal appearing at output terminal 64 is coupled to other circuitry for use thereby. In addition the digital signal is coupled to summing point 27 through resistor 68. Resistor 68 together with capacitor 52 forms an integrating network. The effective capacitance of capacitor 52 is equal to $(A+1)C$ where A is the open loop gain of operational amplifier 25 and C is the capacitance of capacitor 52. The integrating network of resistor 68 and capacitor 52 develop an analog representation of the digital signal appearing at output terminal 64. This signal is combined with the input modulation signal at summing point 27 and the resulting difference signal is amplified in operational amplifier 25. The amplified difference signal is coupled to multivibrator 56 and acts to develop the digital signal output.

In FIG. 3 there is shown a second embodiment of the delta modulator circuit of FIG. 2. Identical circuit elements have the same reference numerals as those in FIG. 2. Operational amplifier 25 of FIG. 2 is represented by block 70 in FIG. 3. Feedback capacitor 52 of FIG. 2 has been eliminated in the circuit of FIG. 3. The bypass capacitor 50 of FIG. 2 has been replaced by a capacitor 71 in FIG. 3. The value of the capacity of capacitor 71 is sufficient so that it acts as an integrator in conjunction with resistor 68, to integrate the digital signal coupled from multivibrator 56. The integrated digital signal and modulation signal are combined at summing point 27 as previously described and coupled to operational amplifier 70.

In the following table are examples of component values which have been found useful in the circuits described in this application. The circuits are not limited to these values.

| | | |
|---|---|---|
| Resistor 41 | ohms | 1,500 |
| Resistor 42 | do | 220,000 |
| Resistor 43 | do | 220,000 |
| Resistor 62 | do | 3,300 |
| Resistor 68 | do | 47,000 |
| Capacitor 44 | mfd | .02 |
| Capacitor 48 | mfd | .01 |
| Capacitor 50 | mfd | .01 |
| Capacitor 52 | pfd | 100 |
| Capacitor 71 | mfd | .1 |

I claim:

1. A delta modulator, including in combination, amplifier means having input circuit means adapted to receive a modulation signal and output circuit means, digital signal generation means coupled to said output circuit means and being responsive to the output signal therefrom to form a digital signal, first degenerative feedback means including resistance means coupling the output of said digital signal generation means to said input circuit means for applying said digital signal thereto, and second degenerative feedback means including capacitance means, said second degenerative feedback means being coupled between said output circuit means and said input circuit means, said capacitance means and said resistance means forming an integration circuit whereby said digital signal is integrated and combined with said modulation signal.

2. The delta modulator of claim 1 and which further includes clock means coupled to said digital signal generation means for periodically enabling the same.

3. The delta modulator of claim 1 wherein said first degenerative feedback means comprises only resistance means coupling said digital signal generation means to said input circuit means, and said second degenerative feedback means comprises only capacitance means coupling said output circuit means to said input circuit means.

4. A delta modulator, including in combination, operational amplifier means having an input circuit adapted to receive a modulation signal and an output terminal, said operational amplifier means being responsive to a difference signal applied to said input circuit to develop an output signal, multivibrator means coupled to said output terminal and being responsive to said output signal to develop a digital signal, first degenerative feedback means including capacitance means coupling said output terminal to said input circuit for applying said output signal thereto, second degenerative feedback means including resistance means coupling the output of said multivibrator means to said input circuit for applying said digital signal thereto, said capacitance means and said resistance means forming an integration circuit for integrating said digital signal, said integrated digital signal and said modulation signal combining to form said difference signal.

5. The delta modulator of claim 4 wherein said multivibrator means is adapted to assume one of first and second states, said multivibrator being responsive to said output signal above a predetermined threshold level to assume one of said first and second states and further being responsive to said output signal below said predetermined threshold level to assume the other of said first and second states, the output signal from said multivibrator forming a digital signal having a first amplitude with said multivibrator in said first state and a second amplitude with said multivibrator in said second state.

6. The delta modulator of claim 5 which further includes clock means coupled to said multivibrator means for periodically enabling the same, said multivibrator acting to change from one of said first and second states to the other of said first and second states only during said enabling period.

References Cited

UNITED STATES PATENTS

| | | | |
|---|---|---|---|
| 2,885,662 | 5/1959 | Hansen ------------ | 332—9 X |
| 3,022,469 | 2/1962 | Bahrs et al. --------- | 332—14 |
| 3,092,729 | 6/1963 | Cray. | |
| 3,384,823 | 5/1968 | Southworth -------- | 325—38.1 |

ALFRED L. BRODY, Primary Examiner

U.S. Cl. X.R.

332—14, 19; 325—38